(12) United States Patent
Kao

(10) Patent No.: US 7,437,584 B2
(45) Date of Patent: Oct. 14, 2008

(54) APPARATUS AND METHOD FOR REDUCING POWER CONSUMPTION IN ELECTRONIC DEVICES

(75) Inventor: Oliver C. Kao, Cupertino, CA (US)

(73) Assignee: Atmel Corporation, San Jose, CA (US)

( * ) Notice: Subject to any disclaimer, the term of this patent is extended or adjusted under 35 U.S.C. 154(b) by 170 days.

(21) Appl. No.: 11/362,654

(22) Filed: Feb. 27, 2006

(65) Prior Publication Data

US 2007/0200595 A1 Aug. 30, 2007

(51) Int. Cl.
*G06F 1/32* (2006.01)
(52) U.S. Cl. .................. 713/322; 326/39; 326/41; 713/601
(58) Field of Classification Search .......... 713/320, 713/322, 601; 326/39, 41
See application file for complete search history.

(56) References Cited

U.S. PATENT DOCUMENTS

| | | | | |
|---|---|---|---|---|
| 5,572,148 | A | 11/1996 | Lytle et al. ............... 326/41 |
| 5,760,609 | A * | 6/1998 | Sharpe-Geisler ........... 326/93 |
| 6,144,247 | A | 11/2000 | Kim et al. ................ 327/525 |
| 6,150,841 | A | 11/2000 | Agrawal et al. ............ 326/41 |
| 6,172,518 | B1 * | 1/2001 | Jenkins et al. ............. 326/37 |
| 6,331,784 | B1 | 12/2001 | Mason et al. ............... 326/8 |
| 6,374,393 | B1 | 4/2002 | Hirairi ..................... 716/8 |
| 6,434,704 | B1 | 8/2002 | Dean et al. ............... 713/320 |
| 6,536,024 | B1 | 3/2003 | Hathaway ................. 716/6 |
| 6,724,231 | B2 | 4/2004 | Yoshikawa ............... 327/291 |
| 6,737,903 | B2 | 5/2004 | Suzuki .................... 327/293 |
| 6,809,550 | B2 | 10/2004 | Pathak et al. .............. 326/41 |
| 6,822,481 | B1 | 11/2004 | Srikantam et al. .......... 326/93 |
| 6,879,202 | B2 * | 4/2005 | Nguyen ................... 327/295 |
| 2005/0028018 | A1 | 2/2005 | Shikata ................... 713/400 |
| 2005/0242865 | A1 | 11/2005 | Vadi et al. ................ 327/291 |
| 2005/0268195 | A1 | 12/2005 | Lund et al. ............... 714/741 |

FOREIGN PATENT DOCUMENTS

| | | |
|---|---|---|
| JP | 2000035831 A2 | 2/2000 |
| JP | 2001217316 A2 | 8/2001 |

OTHER PUBLICATIONS

NE Asia Online, Albert Tai, Live at Power-Up PLD Effects on System Design, Nov. 2005.

* cited by examiner

*Primary Examiner*—Chun Cao
*Assistant Examiner*—Albert Wang
(74) *Attorney, Agent, or Firm*—Schwegman, Lundberg & Woessner, P.A.

(57) ABSTRACT

An apparatus and method for reducing power consumption in a programmable logic device (PLOD) having multiple logic blocks and macrocells. Power consumption is reduced by detecting programmable switch values in each macrocell and generating a clock control signal based on the switch values. The clock control signal controls a macrocell buffer used for compensating for distortion of clock signals inputted to the macrocell. The macrocell buffer is disabled if the clock signals are not being used by the corresponding macrocell, thereby preventing unnecessary toggling and power consumption.

10 Claims, 5 Drawing Sheets

US 7,437,584 B2

APPARATUS AND METHOD FOR REDUCING POWER CONSUMPTION IN ELECTRONIC DEVICES

FIELD OF INVENTION

The present invention is related to an apparatus and method for reducing power consumption in electronic devices. More particularly, the present invention is related to reducing power consumption in devices such as programmable logic devices (PLDs), complex programmable logic devices (CPLDs), and field-programmable gate arrays (FPGAs).

BACKGROUND

The use of PLDs, such as CPLDs or FPGAs, is growing in mobile electronic devices. With shorter product development cycles, programmable logic devices provide advantages such as last minute hardware modifications and adaptability to changing product requirements. However, power consumption in programmable logic is sometimes greater than custom integrated circuits designed for mobile devices, for example. Higher power consumption in a mobile device, such as a cell phone, is a problem since battery life is limited.

FIG. 1 is an example of a conventional PLD 100. The PLD 100 includes a plurality of logic blocks (LBs) $110_1$ to $110_m$ coupled together through a global bus 130. Each logic block includes macrocells 120 or, in the case of a FPGA, logic elements (LEs). A plurality of clock signals 140 are fed through the global bus 130. The clock signals 140 are used by any logic, such as sequential logic or registers, in each macrocell which require clocking.

Higher power consumption in PLDs may occur because buffers, such as an inverter, are used for maintaining higher frequency clock speeds along a path connecting a clock signal(s) to a macrocell as clock signal distortion increases as the length of a wire increases. The layout of clock signals 140 connected to macrocell 120 is sometimes referred to as a clock-tree or a buffer-tree. Power consumption in the buffers along a clock path becomes greater as clock speeds increase. These buffers consume a large amount of power in the PLD since the clock signals are typically the highest frequency signals in the PLD. Higher frequency signals consume more power since the buffers toggle more frequently. There has been a trend towards increasing clock rates with the demands for more processing power on mobile devices. In a typical PLD 100, the macrocells used depend on the programming loaded from non-volatile memory during initialization of the chip which sets programmable switches within the chip. The switches can be transistors, such as complementary metal oxide semiconductor (CMOS) transistors. The switches determine which logic in the macrocell will be activated and can be electrically-erasable. Each switch may have a binary value of 0 or 1. Often, many of the clock signals 140 become unnecessary since not all of the macrocells require clocking. Therefore, a need exists for reducing power consumption in electronic devices without the limitations of the prior art.

SUMMARY

An apparatus and method for reducing power consumption in a programmable logic device (PLD) is disclosed. Power consumption is reduced by detecting programmable switch values in each macrocell of the PLD and generating a clock control signal based on the switch values. The clock control signal controls a macrocell buffer used for compensating for distortion of clock signal(s) inputted to the macrocell. The macrocell buffer is disabled if the clock signal(s) is not being used by the corresponding macrocell, thereby preventing unnecessary toggling and power consumption. If an entire logic block does not require the use of a clock signal(s), the logic block buffers are disabled. Correspondingly, if none of the logic blocks are using the clock signal(s), the PLD buffers are disabled thereby preventing any clock signals from feeding into the PLD.

BRIEF DESCRIPTION OF THE DRAWING(S)

A more detailed understanding of the invention may be had from the following description, given by way of example and to be understood in conjunction with the accompanying drawings wherein.

DETAILED DESCRIPTION OF THE INVENTION

Figure 1:
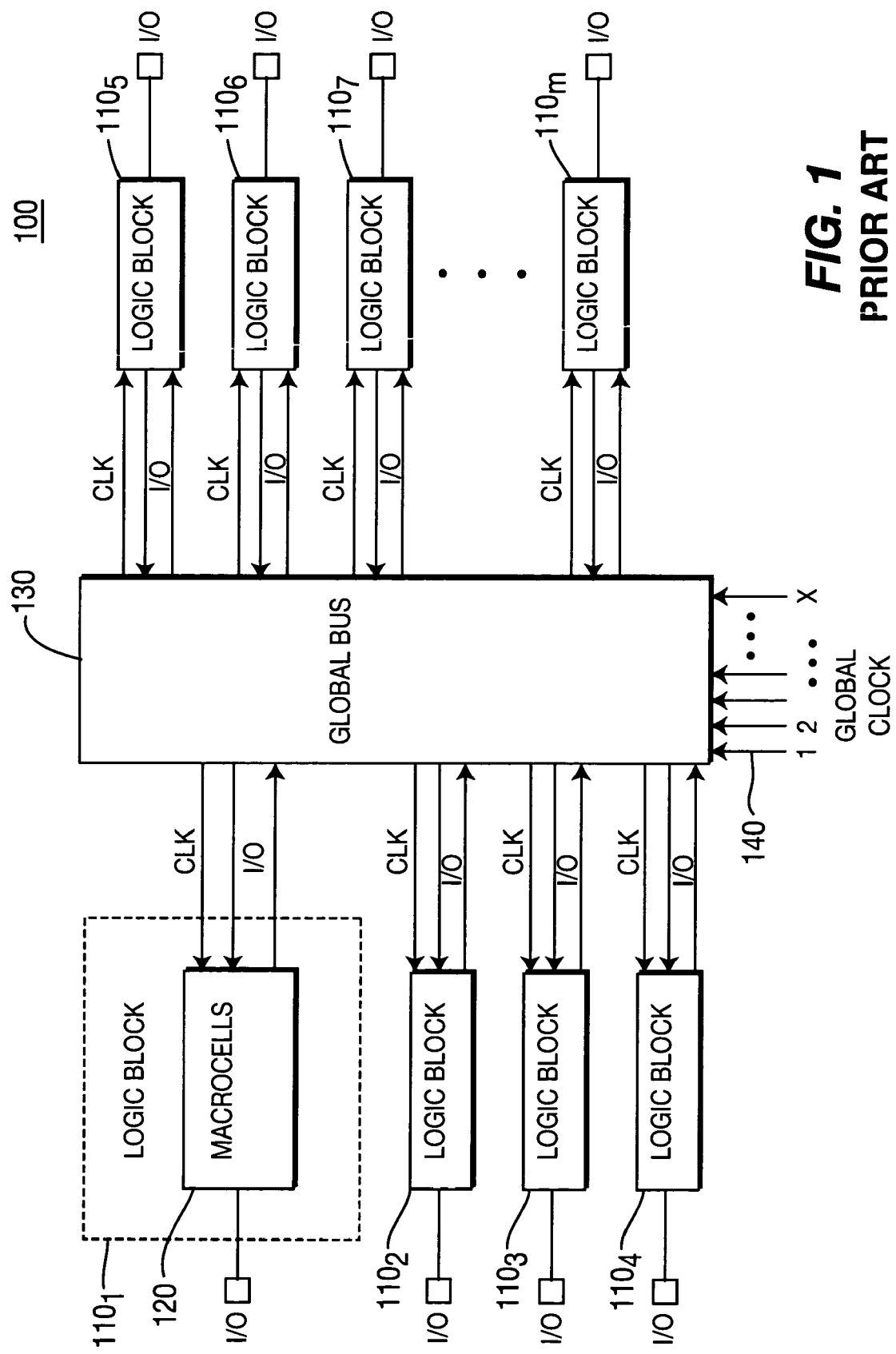
FIG. 1 is an example of a conventional programmable logic device (PLD) device.

The present invention will be described with reference to the drawing figures wherein like numerals represent like elements throughout.

The present invention provides an apparatus and method for efficiently controlling clock buffers in a programmable logic device (PLD) circuit. Power consumption is reduced by disabling or turning off buffers used to feed clock signals to macrocells, logic blocks (LBs), or the entire PLD circuit. By eliminating unnecessary clock toggling, power is conserved. The present invention, purely by way of example, may be used in hand held devices, aerospace applications, cell phones, or personal digital assistants. Of course, the present invention may be implemented in any type of device where a reduction in power consumption is desired.

Figure 2:
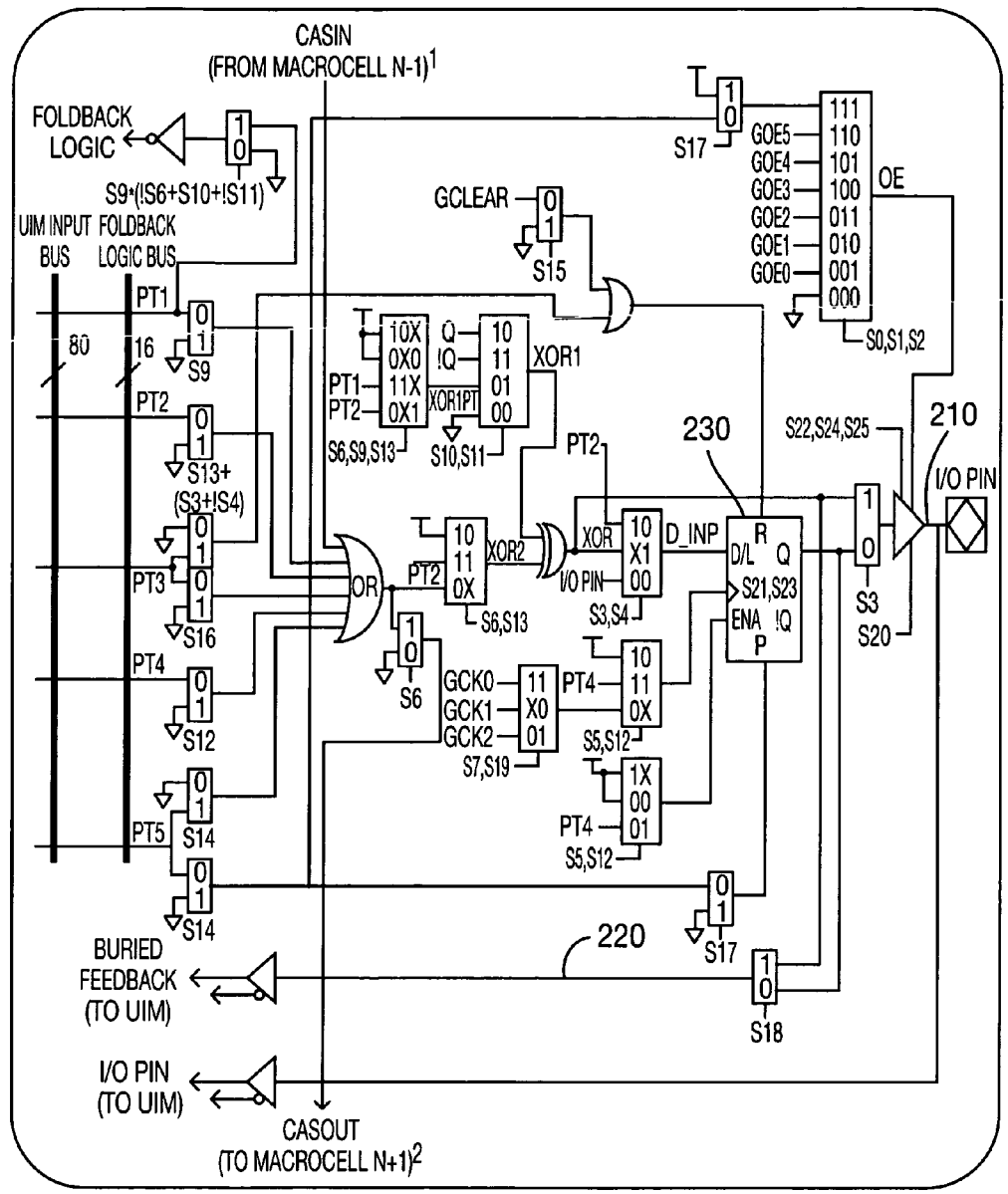
FIG. 2 is an example of a conventional macrocell used in PLDs.

FIG. 2 is an example of a conventional macrocell 200 that is used in a PLD device. The various switches within macrocell 200 may have switch values S0 to S25. The values of the switches are preferably set upon initialization or programming of a circuit. It is noted that these switches may also be referred to as fuses.

Macrocell 200 also comprises product terms PT1-PT5. A product term is typically the result a large AND gate operation and represents a series of switch or fuse values. The macrocell 200 includes both combinational and sequential logic. Combinational logic includes elements such as NOT, AND, OR, and XOR gates Sequential logic includes registers and flip-flops. Generally, sequential logic requires the rising or falling edge of a clock signal in order to change states. In a macrocell, the use of register or sequential logic is sometimes known as register mode. When the macrocell is in register mode (i.e. one or more registers are being used), a clock signal(s) may be used. The macrocell 200 has input and output lines for communicating over the global bus and input/output pins for off chip signals.

Figure 3A:
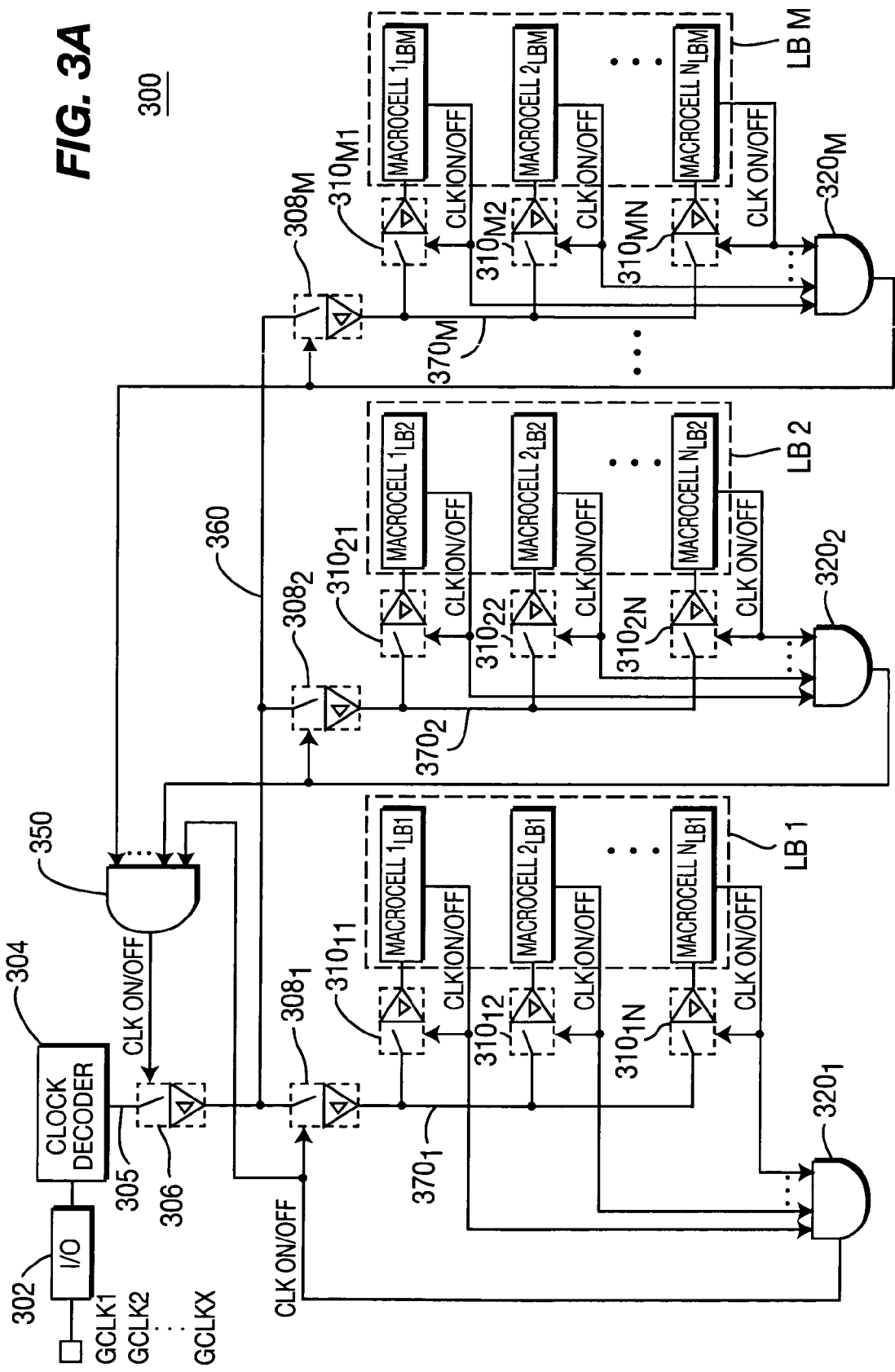
FIG. 3A is an illustration of a PLD in accordance with an embodiment of the present invention.

Referring now to FIG. 3A, shown is a PLD 300 configured in accordance with a preferred embodiment of the present invention. PLD 300 uses a distributed clock-tree or buffer-tree configuration in order to supply a plurality of global clock signals (GCLKs) GCLK1, GCLK2, . . . GCLKX, to a plurality of logic blocks (LBs) LB 1, LB 2, . . . LB M. The LBs can have from 1 to N macrocells. For instance, there may be 8 LBs wherein each LB includes 16 macrocells. LB 1, LB 2, . . . LB M may also have input/output connections to a bus path (not shown) for communicating data. Global clock signals are fed to the programmable logic device through an I/O device 302. The clock decoder 304 receives the signals and determines which clock signal(s) 305 will be fed to which LBs. A plurality of clock signals can be fed to the macrocells since each block may use a different clock frequency. Therefore, connections 360 and $370_1$ to $370_M$ may be bus lines having the ability to carry multiple clock signals. The clock decoder 304 outputs a clock signal(s) 305 to a buffer device 306. Buffer 306 is preferably a tri-state buffer or inverter. A tri-state buffer is a component that takes an input bit, 0 or 1, and outputs the same value when an enable input signal is equal to bit 0. If the enable signal is equal to bit 1, the output will be bit 0 preventing any clock toggling and any floating inputs from wasting power. While repeating the input value, the tri-state buffer is effectively amplifying or toggling the value to maintain the clock signal(s) along a connection or wire. However, the buffer 306 can just as easily be a controllable inverter or amplifier that can be turned on or off via an enable signal. Table 1 shows the truth of a tri-state buffer.

TABLE 1

| INPUT | ENABLE | OUTPUT |
|-------|--------|--------|
| 0 | 1 | 0 |
| 1 | 1 | 0 |
| 0 | 0 | 0 |
| 1 | 0 | 1 |

Figure 3B:
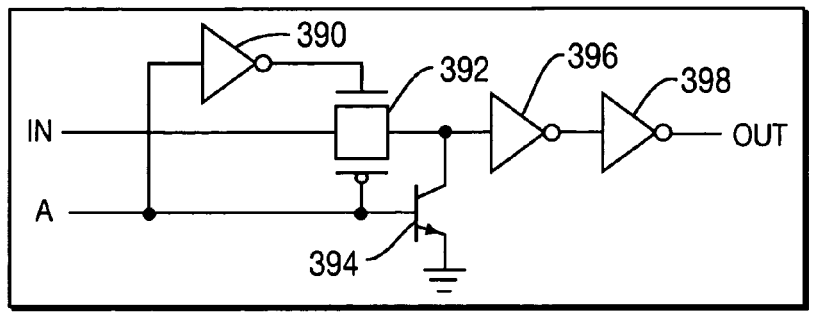
FIG. 3B is an illustration of a tri-state buffer or inverter.

FIG. 3B is an illustration of a tri-state buffer or inverter that may be used in the PLD 300. In FIG. 3B, the enable signal A is preferably fed into an inverter 390, switch 392, and n-type transistor 394. Following the truth table shown in Table 1, if the enable signal A is 1 the input signal IN is disabled and the output signal OUT is equal to 0 regardless of the value of the input signal IN since transistor 394 pulls the input of inverter 396 to ground. If the enable signal A is equal to 0, the value of the output of inverter 398 follows that of the input clock signal IN.

Referring again to FIG. 3A, buffer 306 acts as the main feeder of the clock tree to LB 1, LB 2, . . . LB M. Buffers 306, 308, and 310 are preferably provided in order to maintain the quality of the clock signal(s) traveling along the clock tree and to compensate for any clock distortion. Although only one buffer 306 is shown in FIG. 3A, there may be a plurality of buffers needed along the connection 360 in order to maintain the integrity of the clock signal(s) 305 to LB 1, LB 2, . . . LB M.

The clock signal(s) 305 is fed from buffer 306 to LB 1, LB 2, . . . LB M through tri-state buffers $308_1$, $308_2$, . . . $308_M$. With respect to LB 1, the use of a single tri-state buffer $308_1$ is shown. However, additional buffers may be necessary along $370_1$ in order to maintain the integrity of the clocks traveling along macrocells $1_{LB1}$, $2_{LB1}$, . . . $N_{LB1}$. The clock signal(s) is fed to each macrocell in LB 1 through tri-state buffers $310_{11}$, $310_{12}$, . . . $310_{1N}$ where the first digit of the subscript is the LB with which the buffer is affiliated and the second digit of the subscript is the particular macrocell, within that LB, with which the buffer is affiliated. For instance, buffer $310_{11}$ is affiliated with LB 1 and macrocell $1_{LB1}$.

In LB 2 to LB M, the clock tree operates in the same manner as in LB 1. Clock signal(s) 360 is fed to LB 2 to LB M via buffers $308_2$ to $308_M$, respectively, Similar to $370_1$, additional buffers may be used along $370_2$ to $370_M$ in order to maintain the integrity of the clock signal(s) and to prevent any distortion. The clock signal(s) is fed to each macrocell in LB 2 through tri-state buffers $310_{21}$, $310_{22}$, . . . $310_{2N}$. The clock signal(s) is fed to each macrocell in LB M through tri-state buffers $310_{M1}$, $310_{M2}$, . . . $310_{MN}$.

Figure 4:
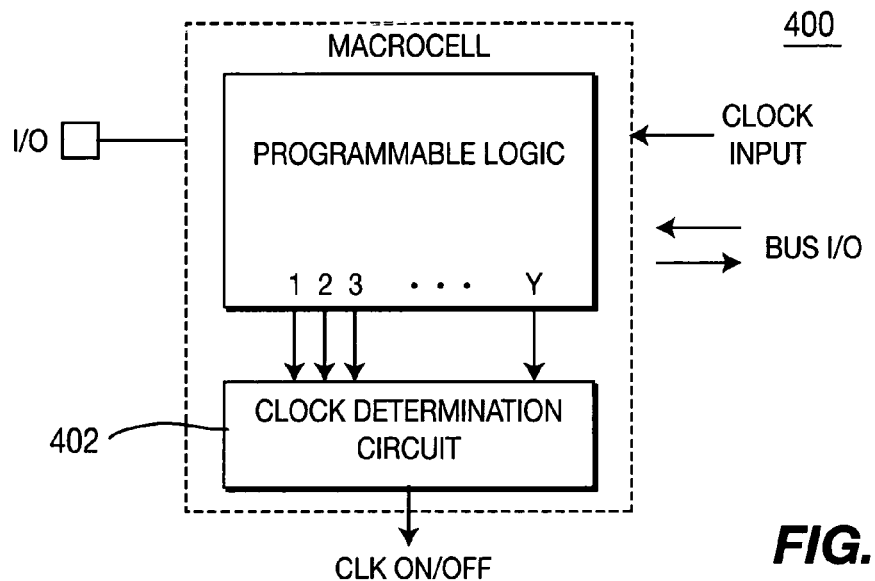
FIG. 4 is a macrocell having a clock determination circuit in accordance with an embodiment of the present invention.

As shown in FIG. 4, each macrocell 400 may have an input/output pin, a bus input/output connection, a clock input, and a clock determination circuit 402. Based on the switch values of the programmable logic 1, 2, 3, . . . Y, the clock determination outputs a CLK on/off value. In the present embodiment a bit 1 indicates that the clock signal(s) should be turned off in the macrocell and a bit 0 indicates that the clock signal(s) should be left on. However, in other embodiments bit 0 can be used to signify that the clock should be turned off. If the clock signal(s) are on, the macrocell is said to be in an active register mode. Otherwise, register mode is inactive. It is noted that register mode may be referred to as sequential mode.

Figure 5:
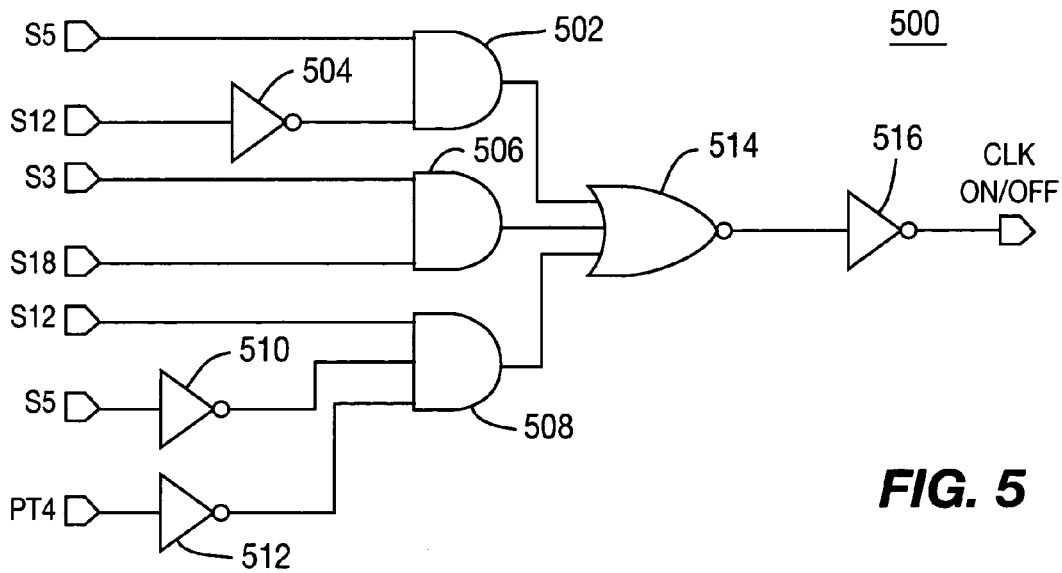
FIG. 5 is a clock determination circuit in accordance with an embodiment of the present invention.

FIG. 5 shows one embodiment of a clock determination circuit 500. A clock determination circuit is composed of various combinational blocks elements such as inverters, AND, and NOR gates. The clock determination circuit 500 can be designed to include any combination of logic gates, sequential or combinational, depending on the number of switch values and structure of the macrocell. Purely by way of example, where clock determination circuit 500 is implemented in a macrocell 200 such as the one shown in FIG. 2, the clock determination circuit 500 includes four inverters 504, 510, 512, 516, three AND gates 502, 506, 508, and an OR gate 514 arranged as shown in FIG. 5. Furthermore, in such an example, inputted into the determination circuit 500 are switch values S3, S5, S12, S18, and PT5. The switch values are bits 0 or 1. S3 is used to determine if the output signal 210 of the macrocell 200 is either combinatorial or register mode. S18 is used to determine if the feedback signal 220 entering the macrocell 200 is either combinatorial or register mode. S5, S12, and PT5 determine the usage of register 230. There are three occasions which can indicate register mode is disabled wherein a connection to a clock signal(s) is not needed:

1. If S3=1 and S18=1, a 1 is outputted from the clock determination circuit 500 and a clock signal(s) is not needed.

2. If S5=1 and S12=0, a 1 is outputted from the clock determination circuit 500 and a clock signal(s) is not needed.

3. If S5=0, S12=1 and PT4=0, a 1 is outputted from the clock determination circuit 500 and a clock signal(s) is not needed.

As shown above, in each of the three occasions shown in the example above, the clock determination circuit 500 outputs a bit value of 1 indicating that the clock signal(s) should be turned off for the macrocell in which the circuit is located, otherwise a bit value of 0 is outputted indicating that the clock signal(s) should be left on. However, in other embodiments bit 0 can be easily used to signify that the clock should be turned off.

Referring again to FIG. 3A, the macrocells each output a CLK on/off control signal (i.e. a decision signal or macrocell control signal) to their respective tri-state buffers 310 in order to indicate if the clock signal(s) entering the macrocells should be turned off or left on. Once the tri-buffers are disabled, no clock signal(s) is fed into their respective macrocells. This in turn prevents the buffers 310 from toggling the clock signals thereby conserving power. It is noted however, that the combinational logic in the macrocells may still be used as desired without the clock signal(s).

In LB 1, the CLK on/off signals are also fed to AND gate $320_1$. If all of the macrocells indicate that the clocks signals are not needed, i.e. all output bit values of 1, the AND gate $320_1$ outputs a value (i.e. a logic block control signal) of 1. The output of AND gate $320_1$ is inputted to tri-state buffer $308_1$. Similar to buffers $310_{11}$, $310_{12}$, $310_{1N}$, the buffer $308_1$ is disabled if no clock signal(s) is being used in LB 1. AND gates $320_2$ to $320_M$ operate in a similar manner. The outputs of AND gates $320_1$, $320_2$,... $320_M$ are also fed into AND gate 350. If all the AND gates $320_1$, $320_2$, ... $320_M$ output a bit 1 indicating that none of the LBs are using the clock signal(s), AND gate 350 outputs a value (i.e. a PLD control signal) of 1 and buffer 306 is disabled. If buffer 306 is disabled, the PLD does not use any clock signals.

Figure 6:
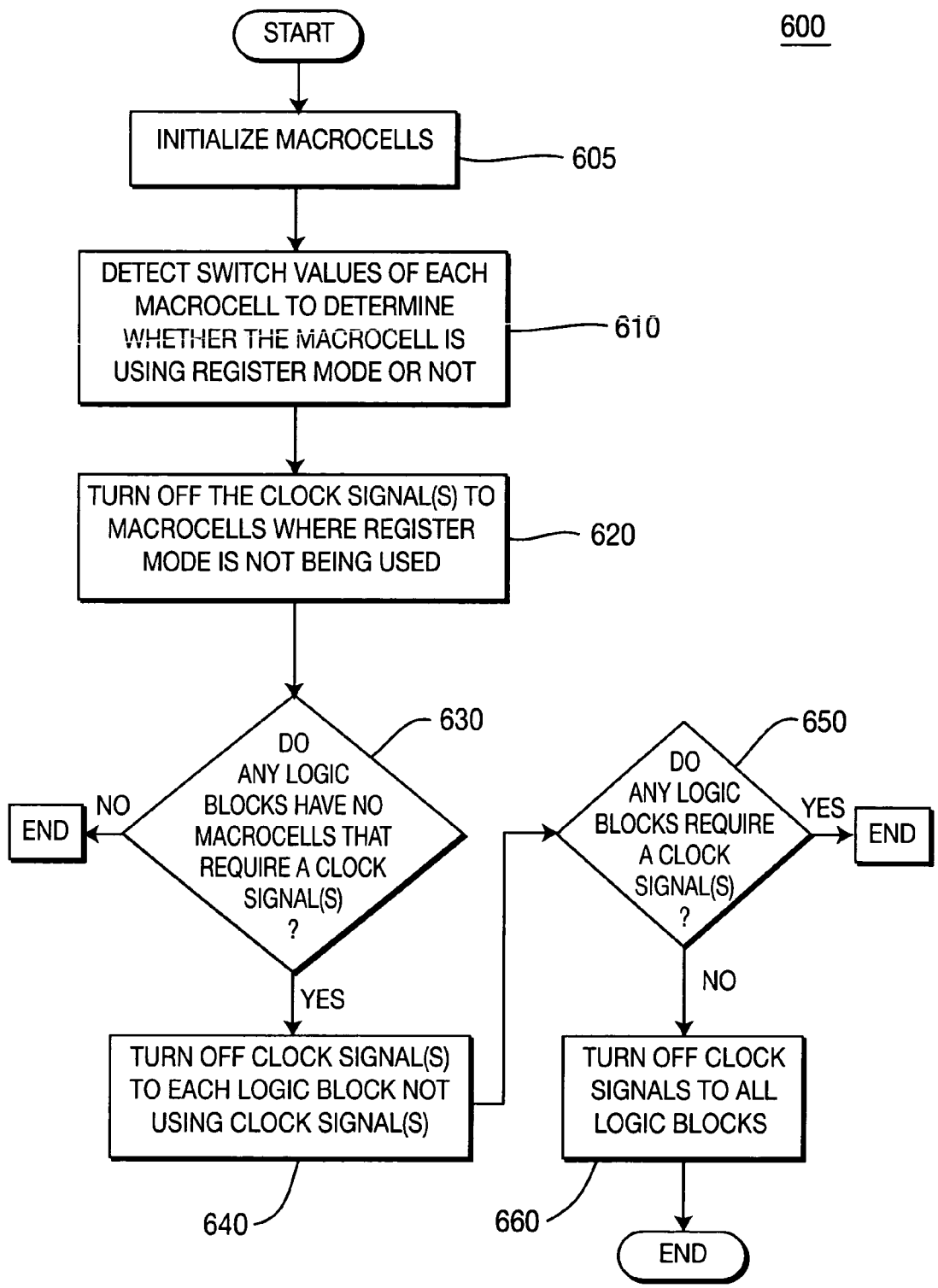
FIG. 6 is a flow chart of a method for reducing power consumption in a PLD in accordance with an embodiment of the present invention.

FIG. 6 shows a flow chart 600 of a method of reducing power consumption in a PLD. In step 605, the PLD macrocells are initialized. Initialization includes setting the fuse or CMOS switch values as previously mentioned. This is typically done by loading data from memory into the macrocells, but of course may be done in any manner known to those skilled in the art. In step 610, the switch values are detected in order to determine if each macrocell is using register or sequential mode (i.e. whether a clock signal(s) are needed or not). In step 620, the clock signal(s) is turned off for all macrocells where register or sequential mode is not being used. In step 630, a determination is made whether there are logic blocks having no macrocells that require clocking. If there is at least one such logic block, in step 640 the clock signal(s) is turned off to each logic block not needing any clock signal(s) for any of its macrocells. In step 650, a determination is made whether any logic blocks require a clock signal(s). If there are no logic blocks requiring any clock signals(s) for any of their respective macrocells, clock signals to all logic blocks are turned off in step 660.

Although the features and elements of the present invention are described in the preferred embodiments in particular combinations, each feature or element can be used alone without the other features and elements of the preferred embodiments or in various combinations with or without other features and elements of the present invention. It is noted that the teachings of present invention may be implemented using software or hardware in any type of electronic device including, but not limited to PLDs, CPLDs, and FPGAs.

What is claimed is:

1. An apparatus for reducing power consumption in a programmable logic device (PLD) comprising:
    a macrocell having a plurality of sequential and combinational logic and a clock determination circuit coupled to the plurality of sequential and combinational logic;
    a buffer coupled to the macrocell for compensating for distortion of at least one clock signal inputted to the macrocell;
    a plurality of programmable switches in the macrocell determining the operation of the plurality of sequential and combinational logic, each programmable switch having a binary value, wherein based on the binary values of the sequential and combinational logic, the clock determination circuit outputs a control signal; and
    wherein the control signal is received by the buffer and disables the buffer when the macrocell can operate without the at least one clock signal.

2. The apparatus of claim 1 wherein the control signal is a binary value.

3. The apparatus of claim 1 wherein the buffer is a tri-state buffer.

4. The apparatus of claim 1 wherein the buffer is a controllable inverter.

5. The apparatus of claim 1 wherein the plurality of programmable switches are fuses.

6. The apparatus of claim 1 wherein the plurality of programmable switches are complementary metal oxide semiconductor (CMOS) switches.

7. The apparatus of claim 1 wherein the PLD is a complex programmable logic device (CPLD).

8. The apparatus of claim 1 wherein the PLD is a field programmable gate array (FPGA).

9. The apparatus of claim 1 wherein the clock determination circuit comprises a plurality of combinational logic gates.

10. The apparatus of claim 1 wherein the at least one clock signal is a plurality of clock signals.

* * * * *

UNITED STATES PATENT AND TRADEMARK OFFICE
CERTIFICATE OF CORRECTION

PATENT NO. : 7,437,584 B2  Page 1 of 1
APPLICATION NO. : 11/362654
DATED : October 14, 2008
INVENTOR(S) : Kao It is certified that error appears in the above-identified patent and that said Letters Patent is hereby corrected as shown below:

On the title page, item (57), under "Abstract", in column 2, line 2, delete "(PLOD)" and insert -- (PLD) --, therefor.

In the Drawings on sheet 2 of 5, in Fig. 2 (Above Diagram), line 1, insert -- 200 --. (Above Diagram)

In column 1, line 26, delete "$110_i$" and insert -- $110_1$ --, therefor.

In column 2, line 59, after "gates" insert -- . --.

In column 3, line 16, delete "$370_i$" and insert -- $370_1$ --, therefor.

In column 3, line 29, after "truth" insert -- table --.

In column 6, line 34, in Claim 7, delete "I" and insert -- 1 --, therefor.

Signed and Sealed this

Sixth Day of January, 2009

JON W. DUDAS
*Director of the United States Patent and Trademark Office*